(12) United States Patent
Gonska et al.

(10) Patent No.: US 8,035,209 B2
(45) Date of Patent: Oct. 11, 2011

(54) MICROMECHANICAL DEVICE WHICH HAS CAVITIES HAVING DIFFERENT INTERNAL ATMOSPHERIC PRESSURES

(75) Inventors: Julian Gonska, Reutlingen (DE); Ralf Hausner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 136 days.

(21) Appl. No.: 12/535,243

(22) Filed: Aug. 4, 2009

(65) Prior Publication Data

US 2010/0028618 A1 Feb. 4, 2010

(30) Foreign Application Priority Data

Aug. 4, 2008 (DE) .................... 10 2008 040 970

(51) Int. Cl.
*H01L 23/31* (2006.01)
*H01L 23/02* (2006.01)
*H01L 23/04* (2006.01)

(52) U.S. Cl. ... 257/682; 257/684; 257/723; 257/E23.18; 257/E23.181; 257/E23.128

(58) Field of Classification Search .................. 257/682, 257/684, 723, E23, 18, E23.181, E23.128
See application file for complete search history.

(56) References Cited

U.S. PATENT DOCUMENTS

| | | | |
|---|---|---|---|
| 2002/0051258 A1* | 5/2002 | Tamura | 358/514 |
| 2008/0136000 A1* | 6/2008 | Fischer et al. | 257/682 |
| 2010/0025845 A1* | 2/2010 | Merz et al. | 257/723 |

* cited by examiner

*Primary Examiner* — Victor A Mandala
(74) *Attorney, Agent, or Firm* — Kenyon & Kenyon LLP

(57) ABSTRACT

A micromechanical device having a substrate wafer has at least one first cavity and one second cavity, the cavities being hermetically separated from each other, the first cavity having a different internal atmospheric pressure than the second cavity. The cavities are capped by a thin film cap. A method is for manufacturing a micromechanical device which has a thin film cap having cavities of different internal atmospheric pressures.

3 Claims, 2 Drawing Sheets

MICROMECHANICAL DEVICE WHICH HAS CAVITIES HAVING DIFFERENT INTERNAL ATMOSPHERIC PRESSURES

CROSS-REFERENCE TO RELATED APPLICATIONS

The present application claims priority to Application No. 10 2008 040 970.7, filed in the Federal Republic of Germany on Aug. 4, 2008, which is expressly incorporated herein in its entirety by reference thereto.

FIELD OF THE INVENTION

The present invention relates to a micromechanical device which has cavities having different internal atmospheric pressures.

For example, the present invention is directed to a micromechanical device which has a substrate wafer having at least one first cavity and one second cavity, the cavities being hermetically separated from each other, the first cavity having a different internal atmospheric pressure than the second cavity.

BACKGROUND INFORMATION

Certain techniques of bonding two substrate wafers for sealing caverns for micromechanical devices are conventional. In wafer bonding, one of the two substrate wafers usually includes micromechanical structures, for example sensor structures. The other substrate wafer, the cap wafer, has recesses. The recesses in the cap wafer and the sensor structures in the sensor wafer are situated such that a hollow space, a so-called cavity, forms above each sensor structure when the wafers are joined by a wafer bonding method. The cavity is hermetically sealed against the environment and thus protects the micromechanical sensor structure against environmental effects, such as moisture and particles. To ensure this, the connecting surface between the two wafers must be arranged such that a hermetic bond connection remains around each individual chip even after the wafer has been separated into individual sensor chips.

The equipment used in the wafer bonding process provides a process pressure to be set, among other things. Since the cavities are hermetically sealed during wafer bonding, the process pressure set on the equipment is encapsulated in each individual cavity in the combined wafer at the sealing temperature. At room temperature, this pressure is reduced according to the ideal gas law. The pressure in the cavities is an important parameter for many applications. In micromechanical acceleration sensors, for example, a relatively high pressure must be encapsulated to ensure adequate damping of the sensor element. Conversely, in micromechanical yaw rate sensors, which are operated resonantly, a low internal pressure is usually selected to ensure high quality as well as a low drive voltage.

Sensor elements are becoming increasingly smaller in micromechanics. Increasing miniaturization provides for multiple sensor elements to be integrated on a single sensor chip. Certain sensor chips simultaneously detect, for example, accelerations in all 3 spatial directions. Due to the process management described above for the wafer bonding method, it is currently not possible to easily integrate different sensor elements having different internal pressures (for example, micromechanical acceleration and yaw rate sensors) on a sensor chip.

Certain publications show a micromechanical component which has multiple cavities having different internal pressures. The cavities are sealed using a wafer capping process. One cavity is opened again and subsequently resealed using an oxide layer at a different internal atmospheric pressure.

SUMMARY

Example embodiments of the present invention provide a micromechanical device which has a substrate wafer having at least one first cavity and one second cavity, the cavities being hermetically separated from each other, the first cavity having a different internal atmospheric pressure than the second cavity. The cavities are capped by a thin film cap.

The micromechanical device according to example embodiments of the present invention, which has cavities having different internal pressures, advantageously includes a substrate wafer and a thin film cap and therefore has a reduced height compared to conventional micromechanical devices. The hermetic connecting surface between the substrate wafer and the cap must advantageously meet only less strict surface requirements because there is no need for a complex bond connection. The cavities may advantageously have smaller dimensions because the thin film capping process permits more precise dimensioning of the cavities.

The thin film cap advantageously includes at least one first thin film, one second thin film, and one third thin film. According to example embodiments of the present invention, the first thin film is situated directly above the first and second cavities and has first access openings to the first cavity as well as second access openings to the second cavity, the second thin firm seals the second access openings, and the third thin film seals the first access openings. The first thin film advantageously defines the cavities. Due to the structure having the second and third thin films, different atmospheric pressures may be advantageously encapsulated in the caverns. The fact that the first access openings have a larger diameter than the second access openings is also advantageous. It is thus advantageously possible to selectively seal access openings using the second and third thin films, even though the second and third thin films are deposited evenly over the first thin film.

Sensor structures are advantageously situated in at least two of the cavities. The sensor structures are particularly advantageously at least one micromechanical yaw rate sensor and at least one micromechanical acceleration sensor. The yaw rate sensor is advantageously situated in a cavity having an internal atmospheric pressure which is lower than that of the acceleration sensor, which is situated in another cavity. In this manner, a movable structure of the yaw rate sensor is advantageously damped to a lesser degree than a movable structure of the acceleration sensor.

Example embodiments of the present invention provide a method for manufacturing a micromechanical device which has a thin film cap, having cavities of different internal atmospheric pressures. The method provides for multiple micromechanical sensor elements having different internal pressure requirements to be integrated on a single sensor chip. In contrast to conventional arrangements, a second chip or wafer is not required for the purpose of capping. Using this method, therefore, it is possible to reduce the utilized silicon surface as well as to reduce the package size.

Example embodiments of the present invention are suited, in particular, for integrating capped micromechanical semiconductor sensors, such as yaw rate sensors, acceleration sensors, chemical sensors, pressure sensors, or microphones. In particular, this provides for a sensor chip to be produced which combines a multi-axial acceleration sensor and a multi-axial yaw rate sensor on a single chip for use, for example, in consumer goods.

According to example embodiments of the present invention, a micromechanical device includes a substrate wafer which has at least one first cavity and at least one second cavity, the cavities being hermetically separated from each other, the first cavity having a different internal atmospheric pressure than the second cavity. The cavities are capped by a thin film cap.

The thin film cap may have at least one first thin film, at least one second thin film, and at least one third thin film.

The first thin film may be situated directly above the first and second cavities and may have first access openings to the first cavity as well as second access openings to the second cavity, the second thin film may seal the second access openings, and the third thin film may seal the first access openings.

The first access openings may have a larger diameter than the second access openings.

According to example embodiments of the present invention, a method for manufacturing a micromechanical device including a substrate wafer having has at least one first cavity and one at least one second cavity, the cavities being hermetically separated from each other, the first cavity having a different internal atmospheric pressure than the second cavity, includes: providing a substrate wafer having first and second micromechanical structures covered by first and second sacrificial layer areas; depositing a first thin film onto the substrate wafer and the first and second sacrificial layer areas; producing first access openings in the first thin film which extend to the first sacrificial layer areas, and producing second access openings in the first thin film which extend to the second sacrificial layer areas; introducing an etching medium through the first and second access openings and selectively etching the first and second sacrificial layer areas such that first and second cavities are formed; depositing a second thin film over the first thin film and sealing the second access openings to the second cavity with the aid of the second thin film; depositing a third thin film over the second thin film and sealing the first access openings to the first cavity with the aid of the third thin film.

The first access openings may be produced to have a larger diameter than the second access openings.

The first access openings may be constricted by depositing the second thin film.

DETAILED DESCRIPTION

Figure 1:
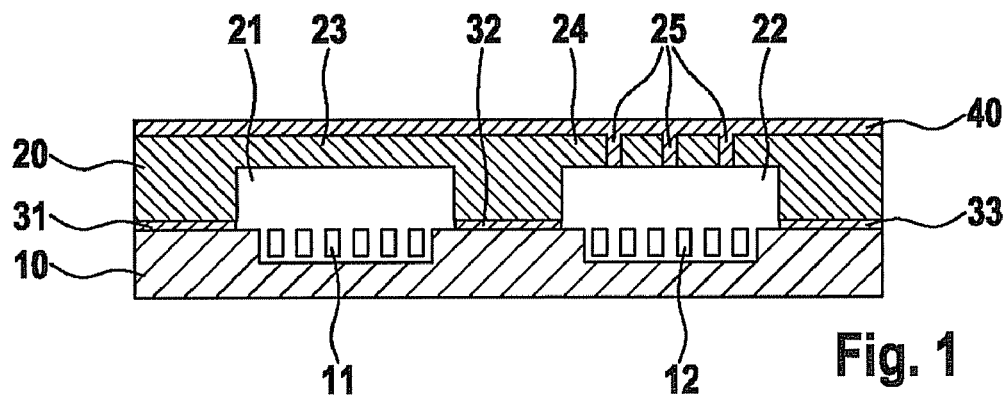
FIG. 1 shows a conventional micromechanical device which has cavities having different internal pressures.

FIG. 1 shows a conventional micromechanical device which has cavities having different internal pressures. A substrate wafer 10 includes two micromechanical sensor structures 11 and 12. A second substrate wafer 20 includes two cavities 21 and 22, each of which is located over micromechanical sensor structures 11 and 12. The two substrate wafers 10 and 20 are connected to each other in three regions 31, 32, and 33 by bonding frames via an intermediate layer, with the aid of a wafer bonding method. Bonding frame 32 hermetically separates the two cavities 21 and 22 from each other, while bonding frames 31 and 33 hermetically separate the cavities from the environment. A diaphragm area 23 and 24 is located above each of cavities 21 and 22. A thin film 40 is located on the surface of substrate wafer 20. Substrate wafer 20 has one or more access holes 25 in diaphragm area 24. The diameter of access holes 25 is selected such that the holes are completely sealed when thin film 40 is deposited. The process parameters during wafer bonding or during sealing of the holes are selected such that the internal pressure in cavity 21 differs by any amount from the internal pressure in cavity 22. For example, the so-called chemical vapor deposition (CVD) method, in which a thin film is deposited from a gas phase by a chemical reaction, is suitable for this process step. Silicon oxide, for example, is suitable as the material for the thin film. CVD methods may be carried out in different pressure ranges. For example, the plasma enhanced CVD (PECVD) method is carried out within a pressure range between 3 mbar and 6 mbar. The Atmospheric Pressure CVD (APCVD) method, on the other hand, is carried out at atmospheric pressure. Since cavity 22 is sealed in the process, the pressure present in the chamber is encapsulated during the process. In the example, access holes 25 may be sealed by an APCVD method. At the end of the process, an internal pressure of 1 mbar is present in cavity 21 and atmospheric pressure is present in cavity 22.

Depending on the selected deposition processes and deposition conditions, the result is that cavity 21 contains an internal pressure between 0.1 mbar and 10 mbar and cavity 22 contains an internal pressure between 100 mbar and 1,500 mbar. Important deposition conditions are deposition temperature and deposition pressure.

Figure 2:
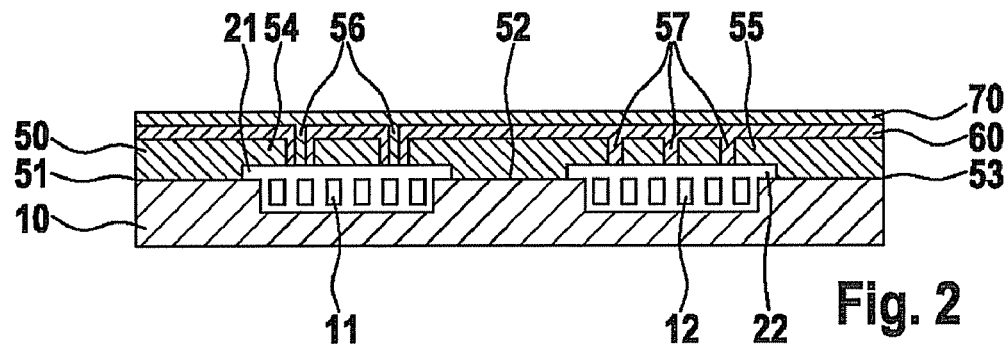
FIG. 2 shows a micromechanical device according to an example embodiment of the present invention, which has cavities having different internal pressures.

FIG. 2 shows a micromechanical device according to an example embodiment of the present invention which has cavities having different internal pressures. According to example embodiments of the present invention, a so-called thin film cap 100 is provided to seal the cavities. In contrast to a wafer cap, a thin film cap includes one or more deposited films which form a cap only after the film material is deposited. In the wafer capping process, a finished cap structure is mounted in a single piece, as described in FIG. 1. Substrate wafer 10 of the micromechanical device according to example embodiments of the present invention has a configuration which is not substantially different from the design described in FIG. 1. It also includes two micromechanical sensor structures 11 and 12, which are situated at a distance from each other. According to this example embodiment, a first thin film 50 is used instead of the second substrate wafer to produce the cavities. This thin film may be deposited, for example, by epitaxy. Thin film 50 is connected to substrate wafer 10 in at least three regions 51, 52, and 53. Cavities 21 and 22 produced thereby may be substantially smaller than cavities 21 and 22 from FIG. 1. Connection 52 hermetically separates the two cavities 21 and 22 from each other. A second thin film 60 and a third thin film 70 are located on the surface of first thin film 50. Thin film 50 forms two diaphragm areas 54 and 55 in the area of cavities 21 and 22. One or more access holes 56 are introduced into diaphragm area 54. Diaphragm area 55 includes one or more access holes 57. The diameter of access holes 56 differs from that of access holes 57. The diameter of access holes 57 is selected such that the holes are completely sealed when thin film 60 is deposited. The diameter of access holes 56 is selected such that the holes are completely sealed when thin film 70 is deposited. The process parameters during the deposition of second thin film 60 and during the deposition of third thin film 70 are selected such that a different internal pressure is encapsulated in cavities 21 and 22, this pressure being largely dependent on the method used to deposit the thin film. First thin film 50, second thin film 60, and third thin film 70 form thin film cap 100.

FIGS. 3 A through F show a method according to an example embodiment of the present invention for manufacturing a micromechanical device which has cavities having different internal pressures.

Figure 3A:
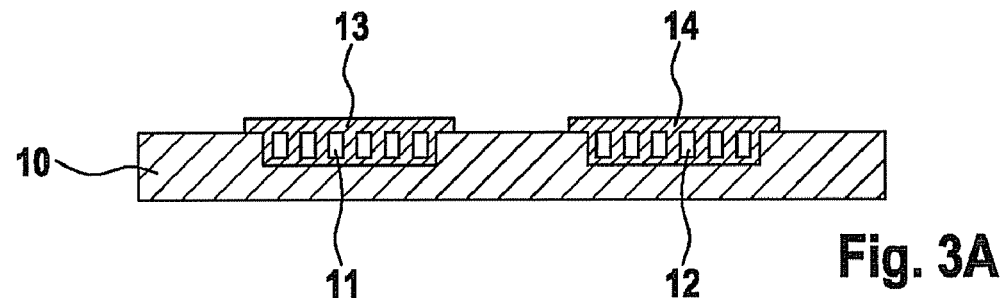
FIGS. 3 A-F show a method according to an example embodiment of the present invention for manufacturing a micromechanical device which has cavities having different internal pressures.
Figure 3B:
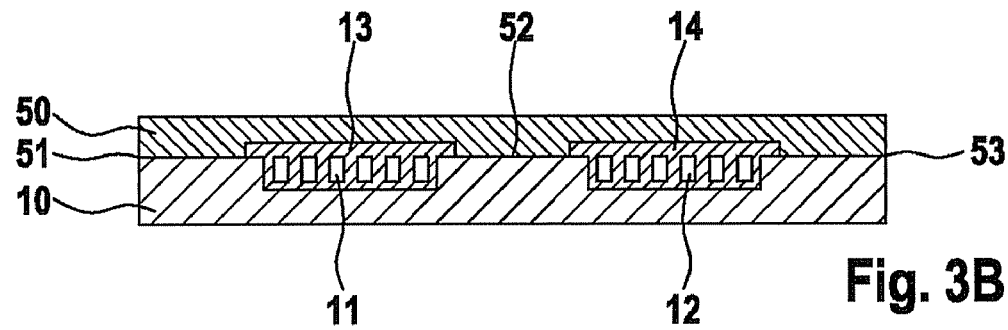
Figure 3C:
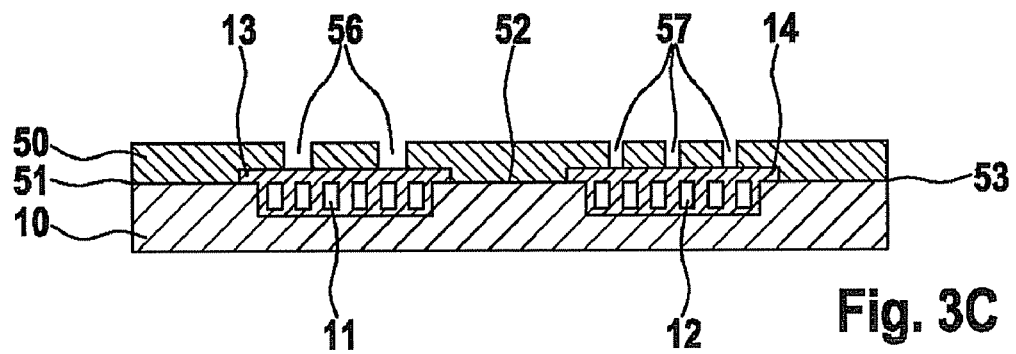
Figure 3D:
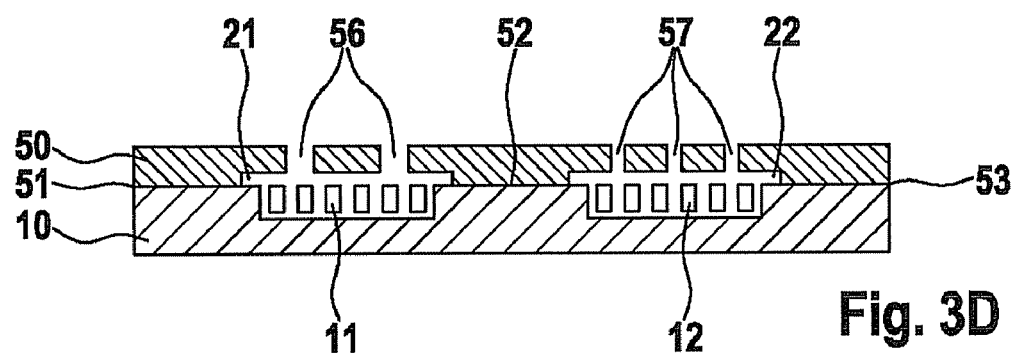
Figure 3E:
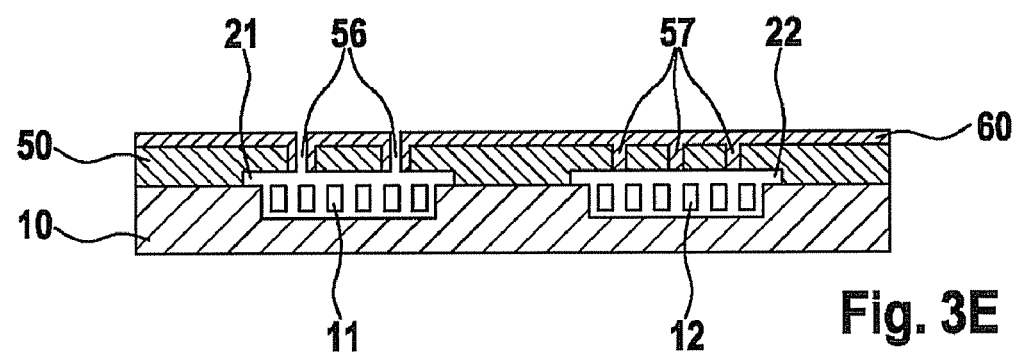
Figure 3F:
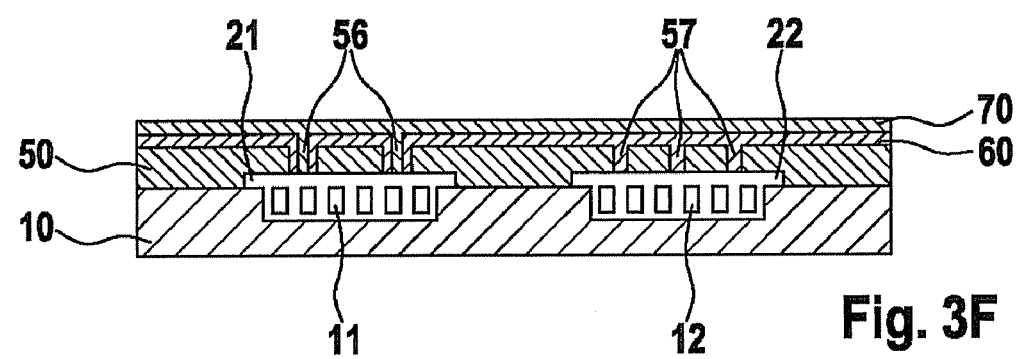

FIG. 3A shows a substrate wafer 10 prior to the deposition of first thin film 50. Sensor structures 11 and 12 are surrounded by a sacrificial layer 13. Silicon oxide, for example, is suitable as sacrificial layer 13.

FIG. 3 B shows how first thin film 50 is deposited in a second process step. First thin film 50 is in direct contact with substrate wafer 10 in three areas 51, 52, 53. In the areas having micromechanical sensor structures 11 and 12, first thin film 50 is deposited on sacrificial layer 13. Epitactically deposited silicon, for example, is suitable as the material for first thin film 50.

FIG. 3 C shows how access holes 56 and 57 are produced above the two sensor structures 11 and 12 in a third process step. In this case, access holes 56 above one sensor element 11 have a different diameter than access holes 57 above the other sensor element 12. A photolithographic masking, for example, is used as the etch mask. A reactive ion etching process is suitable, for example, as the method for producing the access holes. Sacrificial layer 13, which is located beneath first thin film 50, is used as a stop layer.

FIG. 3 D shows how sacrificial layer 13 is removed in a fourth process step. For example, a gaseous etching medium which completely removes the sacrificial material selectively and isotropically in relation to first thin layer 50 is suitable for this purpose. This produces cavities 21 and 22 and exposes micromechanical sensor structures 11 and 12. After the sacrificial layer has been removed, atmospheric pressure is present in both open cavities.

FIG. 3 E shows how second thin film 60 is deposited in a fifth process step. In this case, access holes 57 are completely sealed, while access holes 56 remain open due to their larger diameter. Silicon oxide, for example, is suitable as the thin film material. Like the method described in FIG. 1, a CVD process, for example, may be used as the deposition method. Since access holes 57 are sealed in this process step, and cavity 22 is thus hermetically sealed, the pressure set in the process chamber is present in cavity 22 at the end of the process. For example, if a PECVD method is selected, the internal pressure in the cavity may be 5 mbar.

FIG. 3 F shows how third thin film 70 is deposited in a final process step. In this case, access holes 58 are completely sealed. Silicon oxide may again be used in this case as the thin film material and a CVD process may be used as the deposition method. The internal pressure in cavity 21 differs, in particular, from the internal pressure in cavity 22. For example, an APCVD method may be selected to seal access holes 58. At the end of the process, for example, an internal atmospheric pressure of 5 mbar is present in cavity 22 and an internal atmospheric pressure of 1 atm (approximately 1,013 mbar) is present in cavity 21. Different pressures as described in FIG. 1 are also possible.

What is claimed is:

1. A micromechanical device, comprising:
a substrate wafer which has at least one first cavity and at least one second cavity, the cavities being hermetically separated from each other, the first cavity having a different internal atmospheric pressure than the second cavity; wherein the cavities are capped by a thin film cap, wherein the thin film cap has at least one first thin film, at least one second thin film, and at least one third thin film, wherein the first thin film is situated directly above the first and second cavities and has first access openings to the first cavity as well as second access openings to the second cavity, the second thin film seals the second access openings, and the third thin film seals the first access openings.

2. The micromechanical device according to claim 1, wherein the first access openings have a larger diameter than the second access openings.

3. The micromechanical device according to claim 1, wherein the first access openings have a larger diameter than the second access openings.

\* \* \* \* \*